(12) United States Patent
Kuang

(10) Patent No.: US 8,289,034 B2
(45) Date of Patent: Oct. 16, 2012

(54) CAPACITANCE MEASUREMENT CIRCUIT AND CAPACITANCE MEASUREMENT METHOD THEREOF

(75) Inventor: Yu Kuang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 478 days.

(21) Appl. No.: 12/570,174

(22) Filed: Sep. 30, 2009

(65) Prior Publication Data

US 2010/0102831 A1    Apr. 29, 2010

(30) Foreign Application Priority Data

Oct. 29, 2008   (TW) .............................. 97141684 A

(51) Int. Cl.
*G01R 27/26* (2006.01)

(52) U.S. Cl. ........ 324/676; 324/658; 324/678; 341/139; 341/152

(58) Field of Classification Search .................... 324/713
See application file for complete search history.

(56) References Cited

U.S. PATENT DOCUMENTS

| | | | | | |
|---|---|---|---|---|---|
| 3,886,447 | A | * | 5/1975 | Tanaka | 324/678 |
| 4,187,460 | A | * | 2/1980 | Dauge et al. | 324/678 |
| 4,691,171 | A | * | 9/1987 | Van Roermund et al. | 327/554 |
| 4,723,286 | A | * | 2/1988 | Kamp | 381/3 |
| 5,659,254 | A | * | 8/1997 | Matsumoto et al. | 324/678 |
| 6,278,283 | B1 | * | 8/2001 | Tsugai | 324/678 |
| 6,452,521 | B1 | * | 9/2002 | Wang et al. | 341/139 |
| 6,657,444 | B2 | * | 12/2003 | Fasen | 324/676 |
| 6,838,869 | B1 | * | 1/2005 | Rogers et al. | 324/762.01 |
| 6,962,436 | B1 | * | 11/2005 | Holloway et al. | 374/170 |
| 7,145,350 | B2 | * | 12/2006 | Mellert et al. | 324/678 |
| 7,307,485 | B1 | * | 12/2007 | Snyder et al. | 331/150 |
| 7,324,029 | B2 | * | 1/2008 | Wang | 341/143 |
| 7,354,420 | B2 | * | 4/2008 | Steil et al. | 604/131 |
| 8,030,950 | B2 | * | 10/2011 | Uhov | 324/676 |
| 2001/0006371 | A1 | * | 7/2001 | Bolz | 341/152 |
| 2003/0227291 | A1 | * | 12/2003 | Okagaki et al. | 324/658 |
| 2006/0224109 | A1 | * | 10/2006 | Steil et al. | 604/66 |
| 2007/0182499 | A1 | * | 8/2007 | Wakai et al. | 331/135 |
| 2008/0143348 | A1 | * | 6/2008 | Pavithran et al. | 324/683 |
| 2008/0191713 | A1 | * | 8/2008 | Hauer et al. | 324/658 |
| 2008/0204046 | A1 | * | 8/2008 | Bartling | 324/658 |
| 2009/0046827 | A1 | * | 2/2009 | Tasher et al. | 377/19 |

* cited by examiner

*Primary Examiner* — Timothy J Dole
*Assistant Examiner* — Benjamin M Baldridge

(57) ABSTRACT

A capacitance measurement circuit and a capacitance measurement method thereof. The capacitance measurement circuit for measuring a capacitor under test includes a capacitance to time unit, a continuous time integrator and an analog to digital converter. The capacitance to time unit generates a first clock signal and a second clock signal reverse to the first clock signal according to a first charge time of the capacitor under test and a second charge time of a variable capacitor. The continuous time integrator receives the first clock signal and outputs an integral signal according to the first clock signal. When the number of clocks of the second clock signal is equal to a default value, the analog to digital converter outputs a digital signal corresponding to a capacitance difference between the capacitor under test and the variable capacitor according to the integral signal.

15 Claims, 11 Drawing Sheets

CAPACITANCE MEASUREMENT CIRCUIT AND CAPACITANCE MEASUREMENT METHOD THEREOF

This application claims the benefit of Taiwan application Serial No. 97141684, filed Oct. 29, 2008, the subject matter of which is incorporated herein by reference.

BACKGROUND OF THE INVENTION

1. Field of the Invention

The invention relates in general to a capacitance measurement circuit and a capacitance measurement method, and more particularly to a capacitance measurement circuit using a continuous time integrator, and a capacitance measurement method thereof.

2. Description of the Related Art

FIGS. 1 and 2 (Prior Art) are circuit diagrams showing conventional capacitance measurement circuits 10 and 20. Referring to FIGS. 1 and 2, each of the conventional capacitance measurement circuits 10 and 20 is for measuring a capacitance variation of a capacitor Cz under test and converts the capacitance variation into a digital signal for output. The capacitor Cz under test is a capacitor whose capacitance changes when the capacitor is triggered. For example, the capacitance of a sensing line of a capacitive touch screen in the X direction or Y direction is changed when being touched by a conductor. A capacitor array 150 has the capacitance, which may be selected via a switch, and provides an equivalent capacitor $C_R$, wherein a capacitor Cc has the known capacitance.

$V_Y$ is integrated in an integrating clock signal period NS being set according to the time when the capacitor Cz under test cannot be triggered, and a comparison signal CMPO outputted from the comparator CMP is read after the charging clock signal period NS being set has elapsed. If the capacitance of the capacitor Cz is smaller than that of the equivalent capacitor $C_R$, the comparison signal CMPO outputted from the comparator CMP is low, and a control logic 110 decreases the capacitance of the equivalent capacitor $C_R$ of the capacitor array 150. Oppositely, if the capacitance of the capacitor Cz is larger than that of the equivalent capacitor CR of the capacitor array 150, the comparison signal CMPO outputted from the comparator CMP is high, and the control logic 110 increases the capacitance of the equivalent capacitor $C_R$ of the capacitor array 150. The above-mentioned procedures are repeated until the capacitance setting value of the capacitor array 150 is as that the comparison signal CMPO is low when the minimum unit capacitance that may be adjusted in the capacitor array 150 is increased, and the comparison signal CMPO is high when the minimum unit capacitance is decreased, and sets this capacitance setting value as the capacitance setting value of the capacitor array 150 for measuring the capacitance variation of the capacitor Cz. After the capacitance of the capacitor array 150 is selected, the capacitance variation of the capacitor Cz under test may be measured.

The conventional capacitance measurement circuit 10 adopts the dual slope method to obtain the changed capacitance equal to ND/NC*Cc after being triggered according to the capacitance difference between the capacitor Cz under test and the equivalent capacitor $C_R$, the integrating clock signal period NC, and the clock signal period ND calculated by the counter 120 when the capacitor Cc is reversely integrated.

The conventional capacitance measurement circuit 20 adopts the sigma-delta method. At the beginning, $V_Y$ is set to be a reference voltage V1. If the comparison signal CMPO outputted from the comparator CMP is high, the signal CE outputted from the control logic 110 is high, and the 1-bit signal is transferred to the input terminal of a digital filter 160. The capacitor Cc starts to integrate $V_Y$ reversely to reduce V. When $V_Y$ is lower than the negative end input voltage V1 of the comparator CMP, the comparison signal CMPO outputted from the comparator CMP becomes low, and the signal CE outputted from the control logic 110 is low. In this case, the capacitance difference between the capacitor Cz and the equivalent capacitor $C_R$ starts to integrate $V_Y$ positively so that $V_Y$ is gradually increased. When $V_Y$ is higher than the comparator negative end input voltage V1, the comparison signal CMPO outputted from the comparator CMP becomes high, and the above-mentioned procedures are repeated. Consequently, the digital filter 160 filters out the values of the high and low 1-bit signals of the series of signals CE other than the DC components, the capacitance difference between the capacitor Cz and the equivalent capacitor $C_R$ can be obtained according to the digital output of the digital filter 160.

Each of the conventional capacitance measurement circuits 10 and 20 can measure the increased or decreased variation of the capacitance of the triggered capacitor Cz under test. The condition of V1>V2 is selected if the increased capacitance variation is to be measured after the capacitor Cz under test is triggered; and the condition of V1<V2 is selected if the decreased capacitance variation is to be measured.

However, each of the conventional capacitance measurement circuits 10 and 20 shown in FIGS. 1 and 2 tends to be influenced by the switch noise, and a set of oscillators have to be additionally provided so that the manufacturing cost is increased.

SUMMARY OF THE INVENTION

The invention is directed to a capacitance measurement circuit and a capacitance measurement method thereof, wherein the drawback that the conventional circuit tends to be influenced by the switch noise can be greatly improved, and a clock signal can be provided for other circuits without the need of additionally purchasing oscillators.

According to a first aspect of the present invention, a capacitance measurement circuit for measuring a capacitor under test is provided. The capacitance measurement circuit includes a capacitance to time unit, a continuous time integrator and an analog to digital converter. The capacitance to time unit generates a first clock signal and a second clock signal reverse to the first clock signal according to a first charge time of the capacitor under test and a second charge time of a variable capacitor. The continuous time integrator receives the first clock signal and outputs an integral signal according to the first clock signal. The analog to digital converter outputs a digital signal corresponding to a capacitance difference between the capacitor under test and the variable capacitor according to the integral signal when the number of clocks of the second clock signal is equal to a default value.

According to a second aspect of the present invention, a capacitance measurement method is provided. The capacitance measurement method includes the steps of: (a) setting an integral signal, outputted from a continuous time integrator, to be equal to an initial voltage; (b) generating a first clock signal and a second clock signal reverse to each other according to a first charge time of a capacitor under test and a second charge time of a variable capacitor; (c) outputting the first clock signal to the continuous time integrator and outputting the integral signal according to the first clock signal; and (d) outputting a digital signal corresponding to a capacitance difference between the capacitor under test and the variable capacitor according to the integral signal when the number of clocks of the second clock signal is equal to a default value.

The invention will become apparent from the following detailed description of the preferred but non-limiting embodiments. The following description is made with reference to the accompanying drawings.

DETAILED DESCRIPTION OF THE INVENTION

Figure 1:
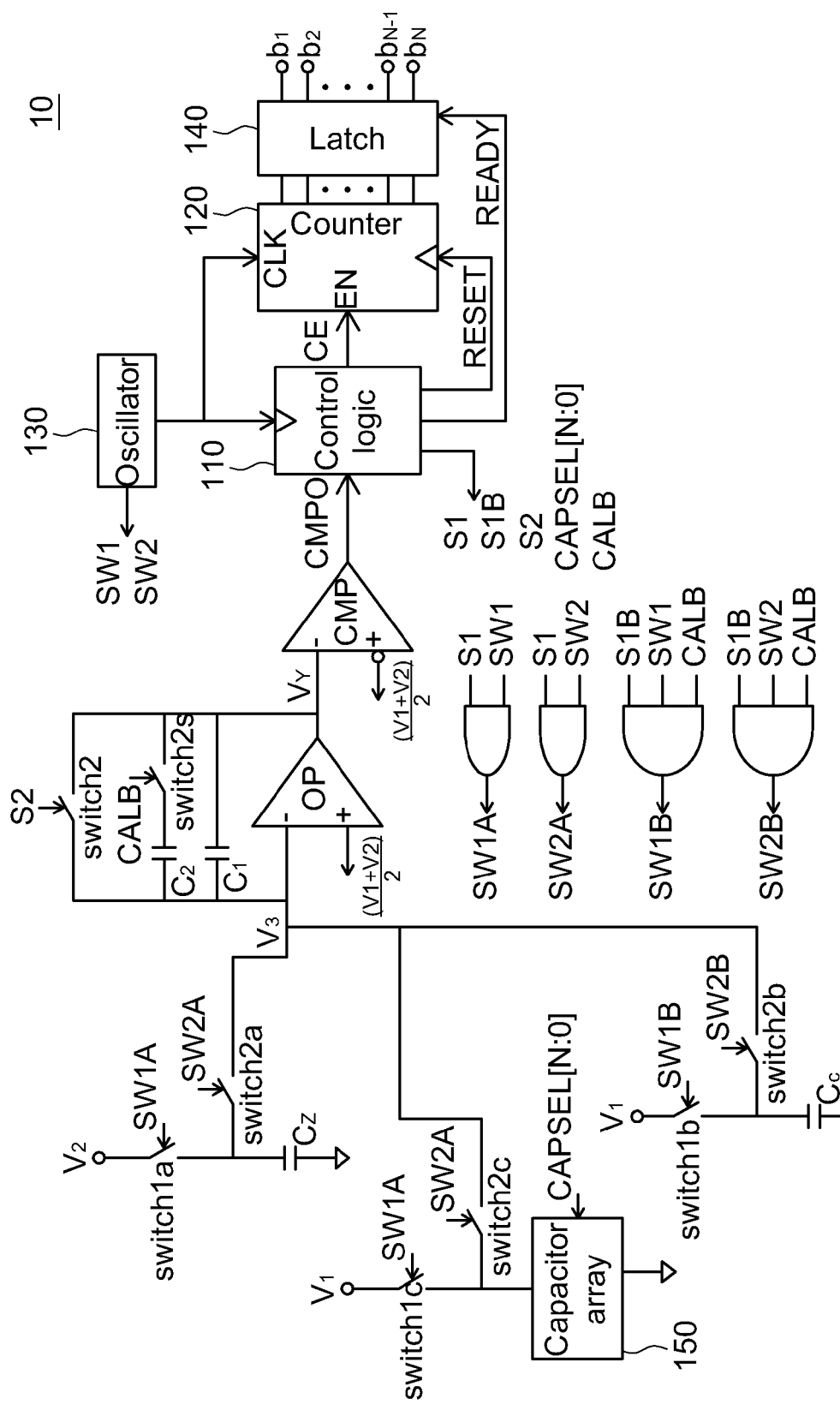
FIG. 1 (Prior Art) is a circuit diagram showing a conventional capacitance measurement circuit.
Figure 2:
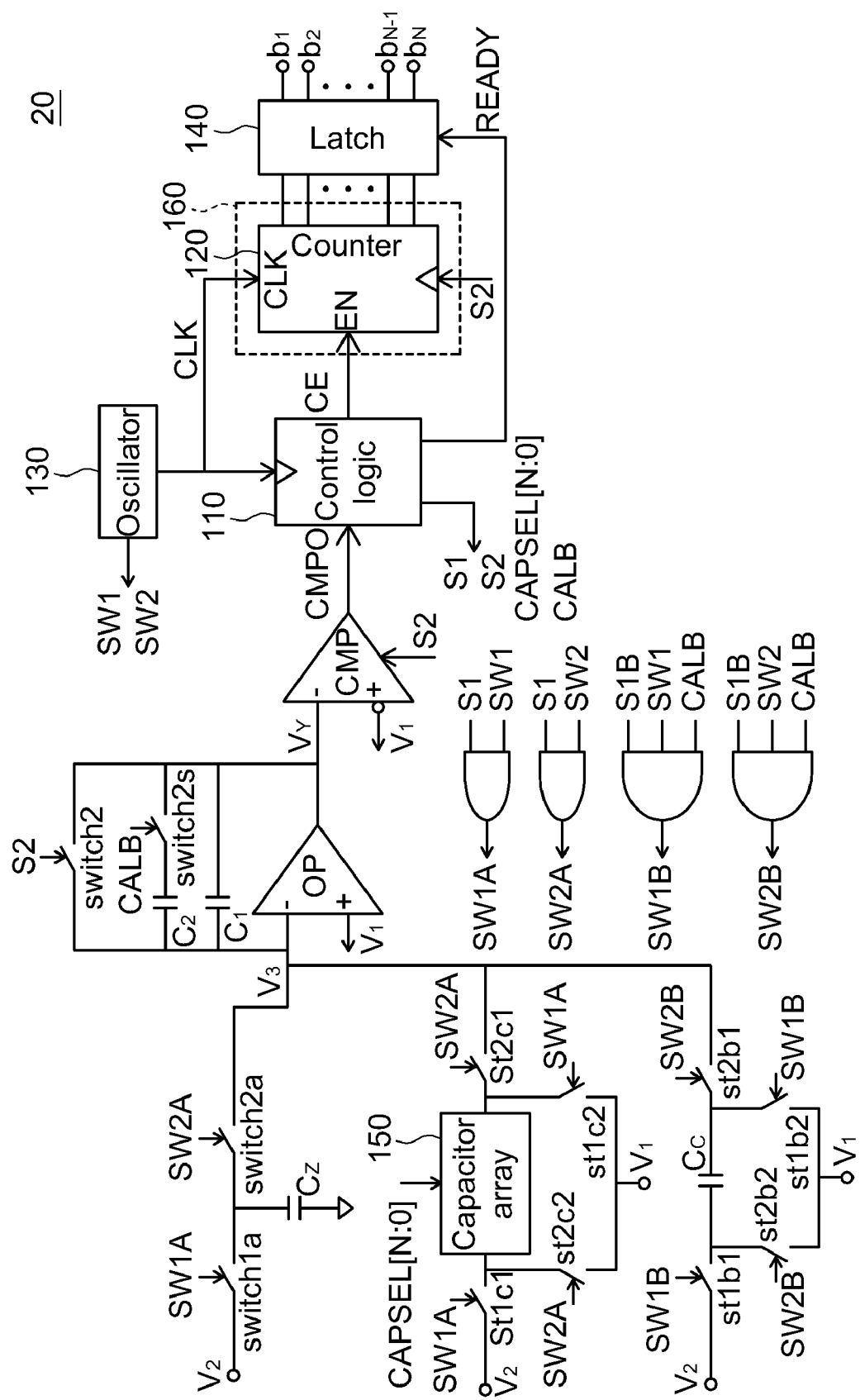
FIG. 2 (Prior Art) is a circuit diagram showing another conventional capacitance measurement circuit.
Figure 3:
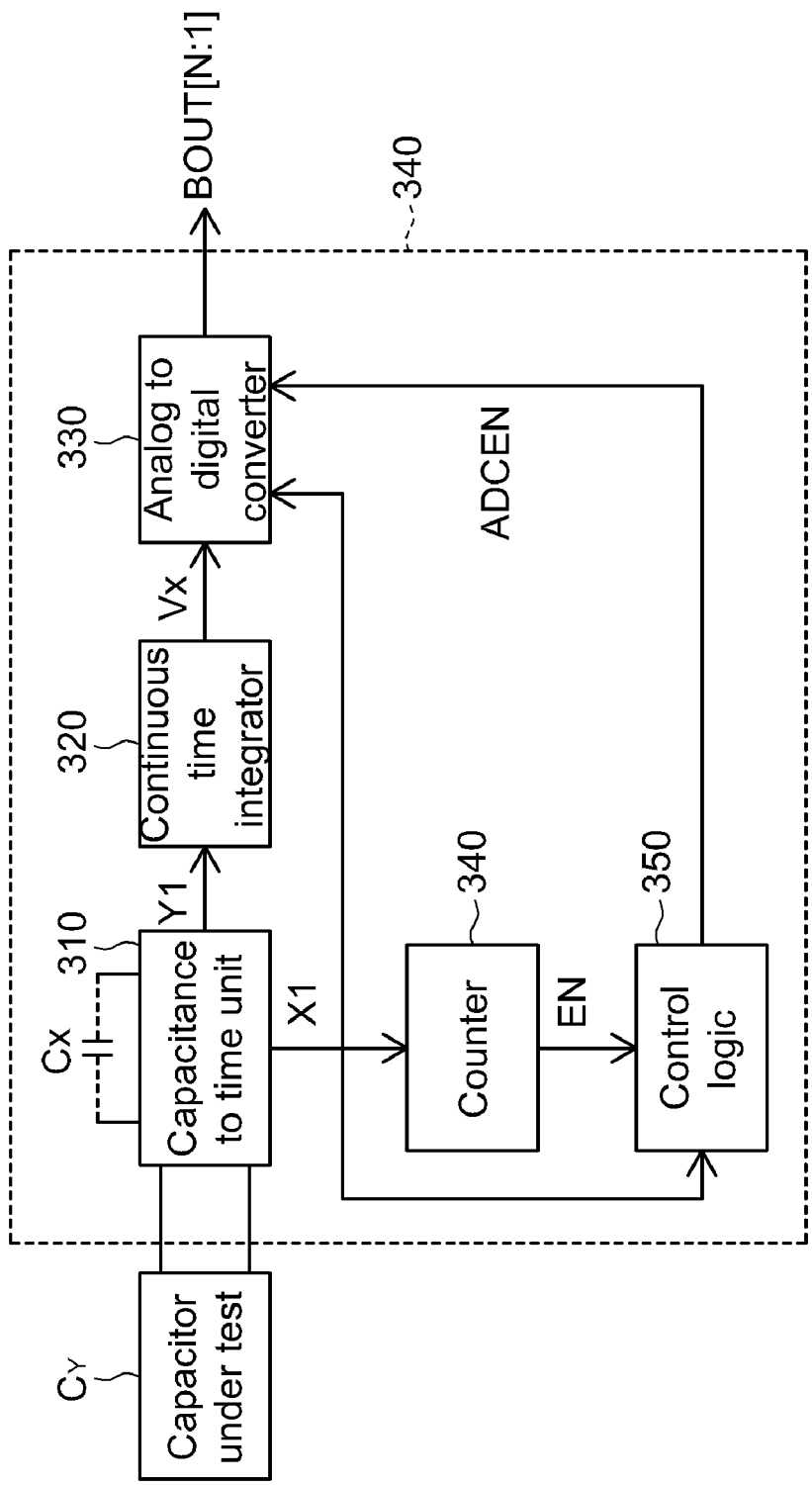
FIG. 3 is a block diagram showing a capacitance measurement circuit according to a first embodiment of the invention.

FIG. 3 is a block diagram showing a capacitance measurement circuit 30 according to a first embodiment of the invention. Referring to FIG. 3, the capacitance measurement circuit 30 for measuring a capacitor $C_Y$ under test and thus outputting a digital signal BOUT[N:1] includes a capacitance to time unit 310, a continuous time integrator 320, an analog to digital converter 330, a counter 340 and a control logic 350.

The capacitance to time unit 310 generates a clock signal Y1 and a clock signal X1 reverse to each other according to a charge time of the capacitor $C_Y$ under test and a charge time of a variable capacitor Cx. The continuous time integrator 320 receives the clock signal Y1, and outputs an integral signal Vx according to the clock signal Y1. The counter 340 counts the number of clocks of the clock signal X1. When the number of clocks of the clock signal X1 is equal to a default value, an enable signal EN is outputted. The control logic 350 outputs an enable signal ADCEN according to the enable signal EN so as to control the analog to digital converter 330 to output the digital signal BOUT[N:1] corresponding to a capacitance difference between the capacitor $C_Y$ under test and the variable capacitor Cx according to the integral signal Vx.

The capacitance measurement circuit 30 causes different time lengths of the positive period and the negative period of the clock signal Y1 according to the difference between the charge times of the capacitor $C_Y$ under test and the variable capacitor Cx so that the output of the integral signal Vx of the continuous time integrator 320 is changed with the change of the capacitance difference between the capacitor $C_Y$ under test and the variable capacitor Cx. The analog to digital converter 330 converts the integral signal Vx into the digital signal BOUT[N:1] for output so that the capacitance of the capacitor $C_Y$ under test can be read.

Unlike the conventional circuit utilizing the discrete-time integrator, the capacitance measurement circuit 30 utilizes the continuous time integrator. So, the switch noise cannot be accumulated after a long time of integrating operation, and the drawback that the conventional circuit is easily influenced by the switch noise can be significantly improved. In addition, if the capacitance variation of the capacitor $C_Y$ under test is not great, for example, the capacitance variation of the capacitors in the X and Y direction of the capacitive touch screen is only about 0.1%, the frequency variation of the clock output X1 of the circuit is also not great. Thus, the clock output may be provided to serve as the clock signal for other circuits without an additionally provided oscillator circuit.

The capacitance to time unit 310 and the continuous time integrator 320 may have different aspects. In order to make the invention clearer, illustrations will be made according to an embodiment.

Embodiment

Figure 4:
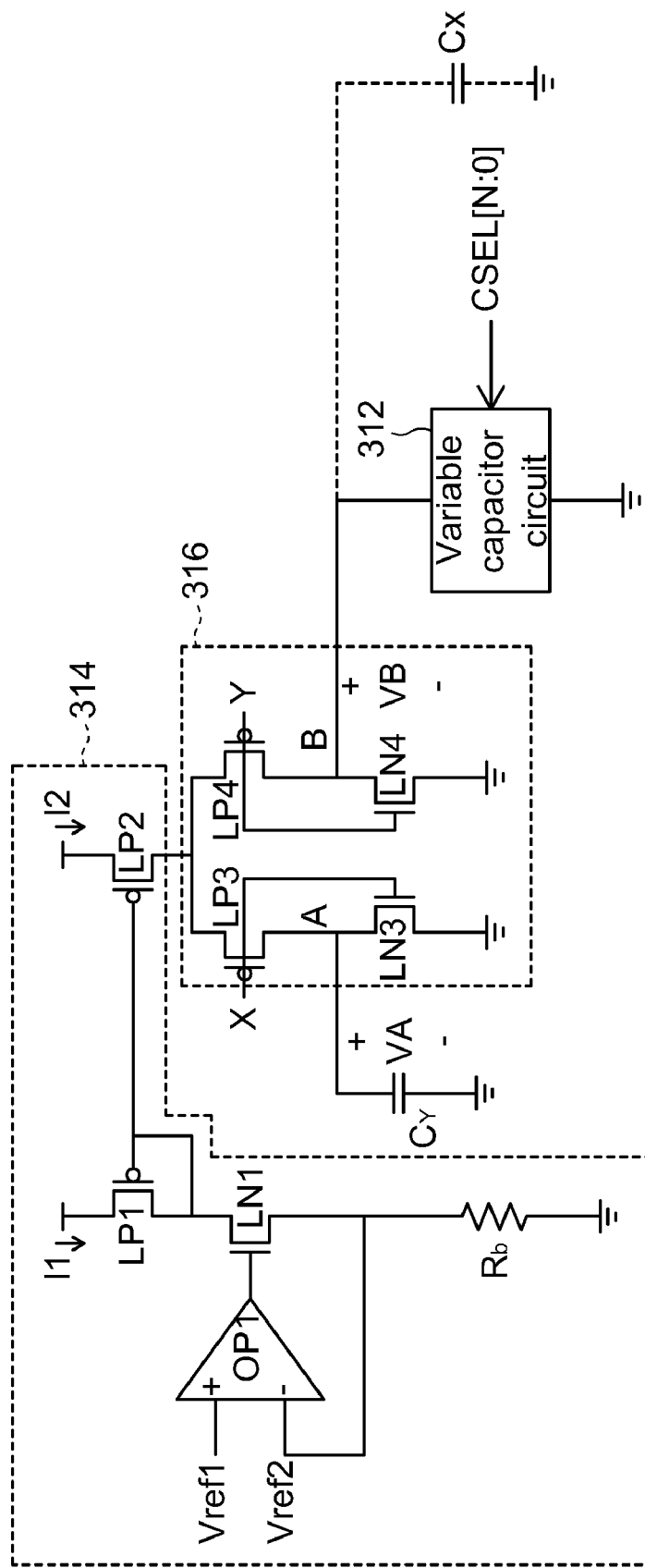
FIG. 4 is a partially detailed circuit diagram showing the capacitance measurement circuit.
Figure 5:
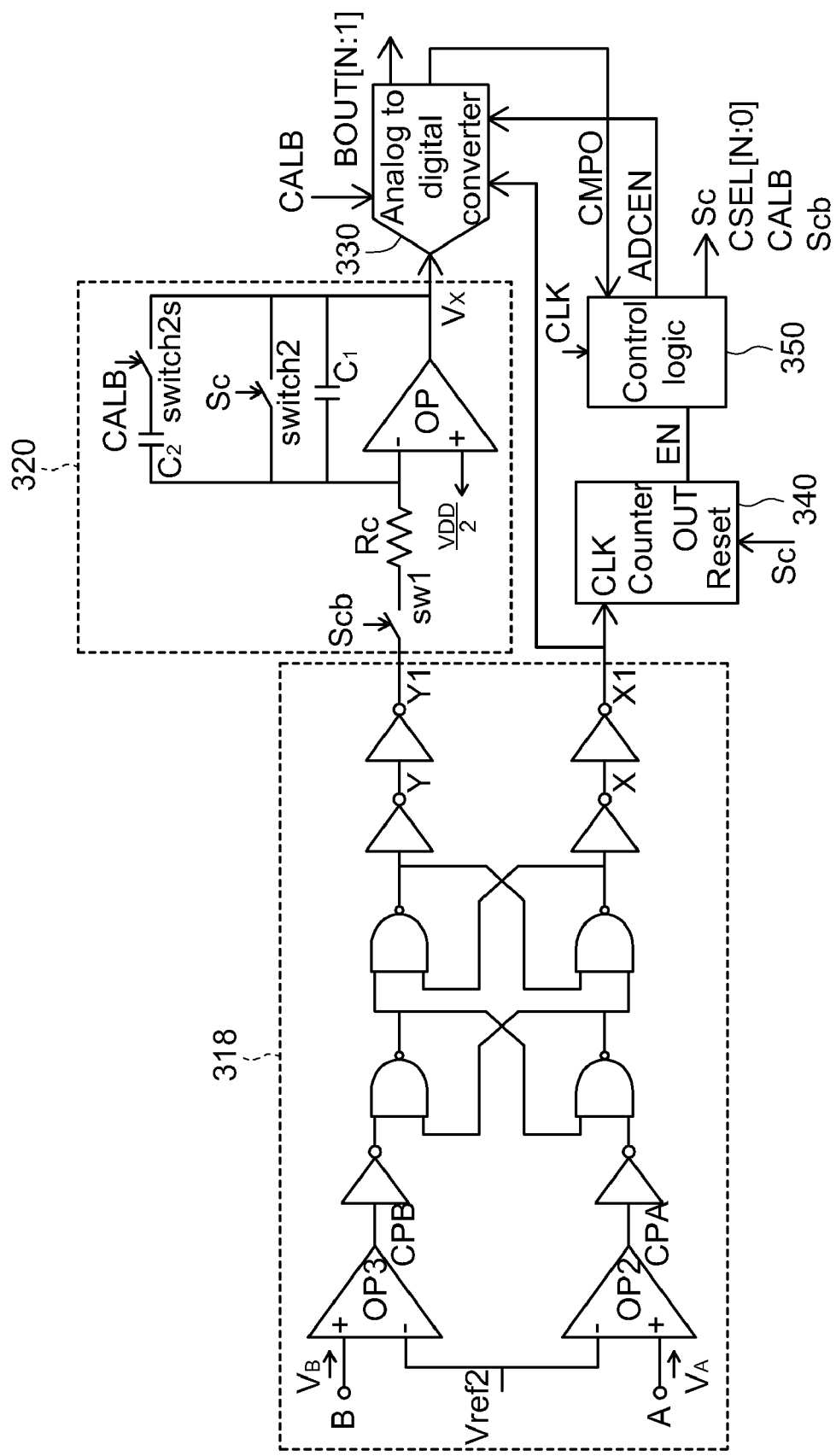
FIG. 5 is another partially detailed circuit diagram showing the capacitance measurement circuit.
Figure 6:
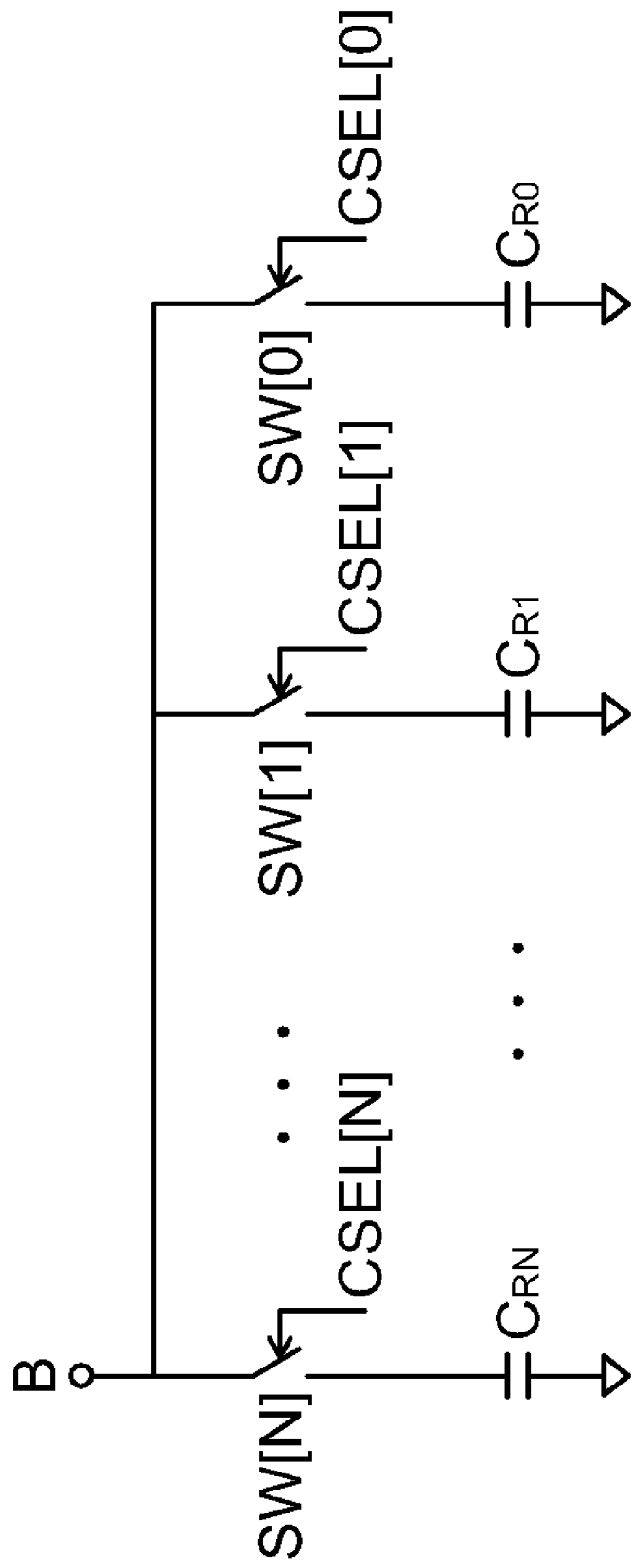
FIG. 6 is a detailed circuit diagram showing a variable capacitor circuit.
Figure 7:
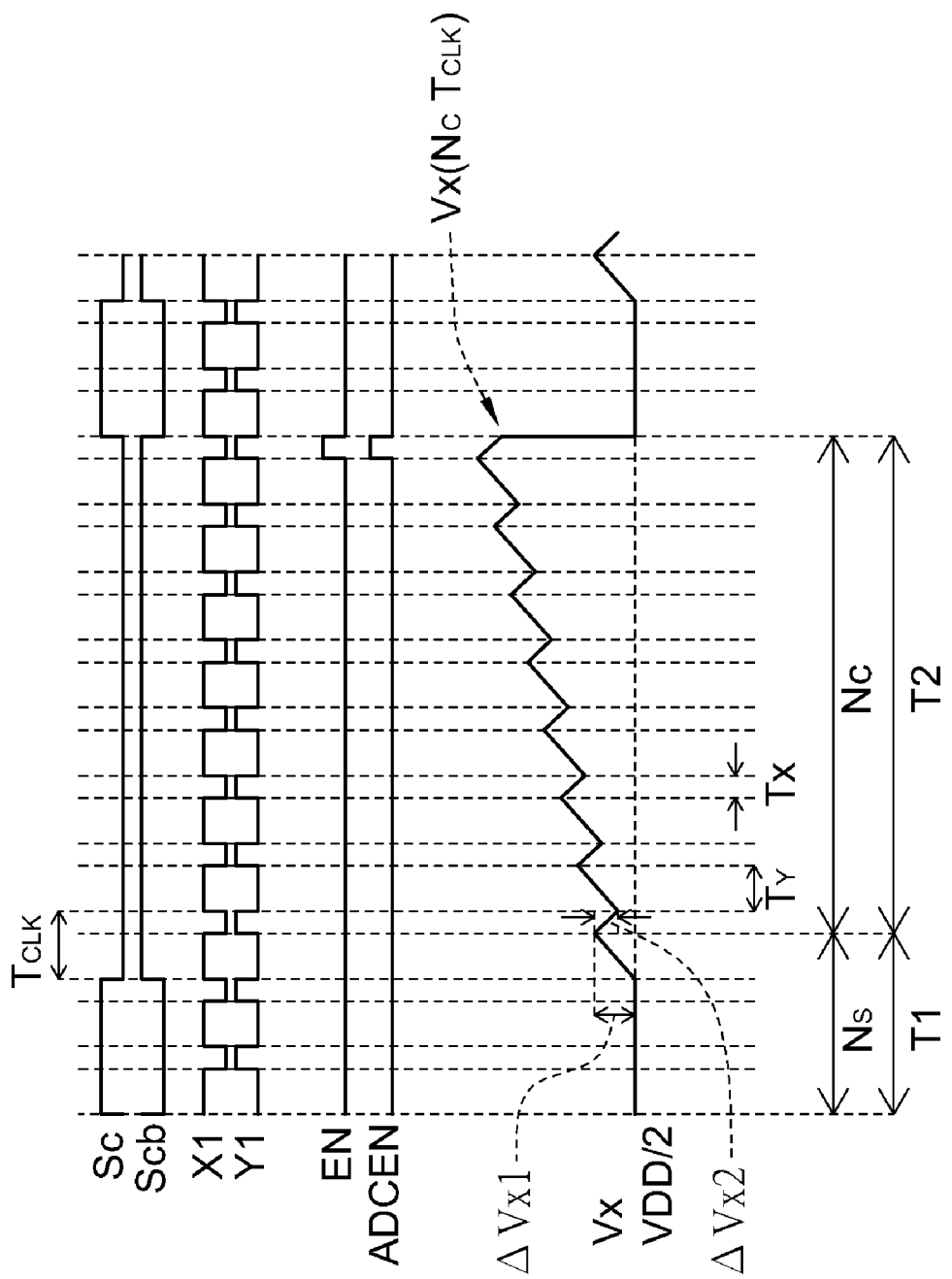
FIG. 7 shows a signal timing chart of the first embodiment.
Figure 8:
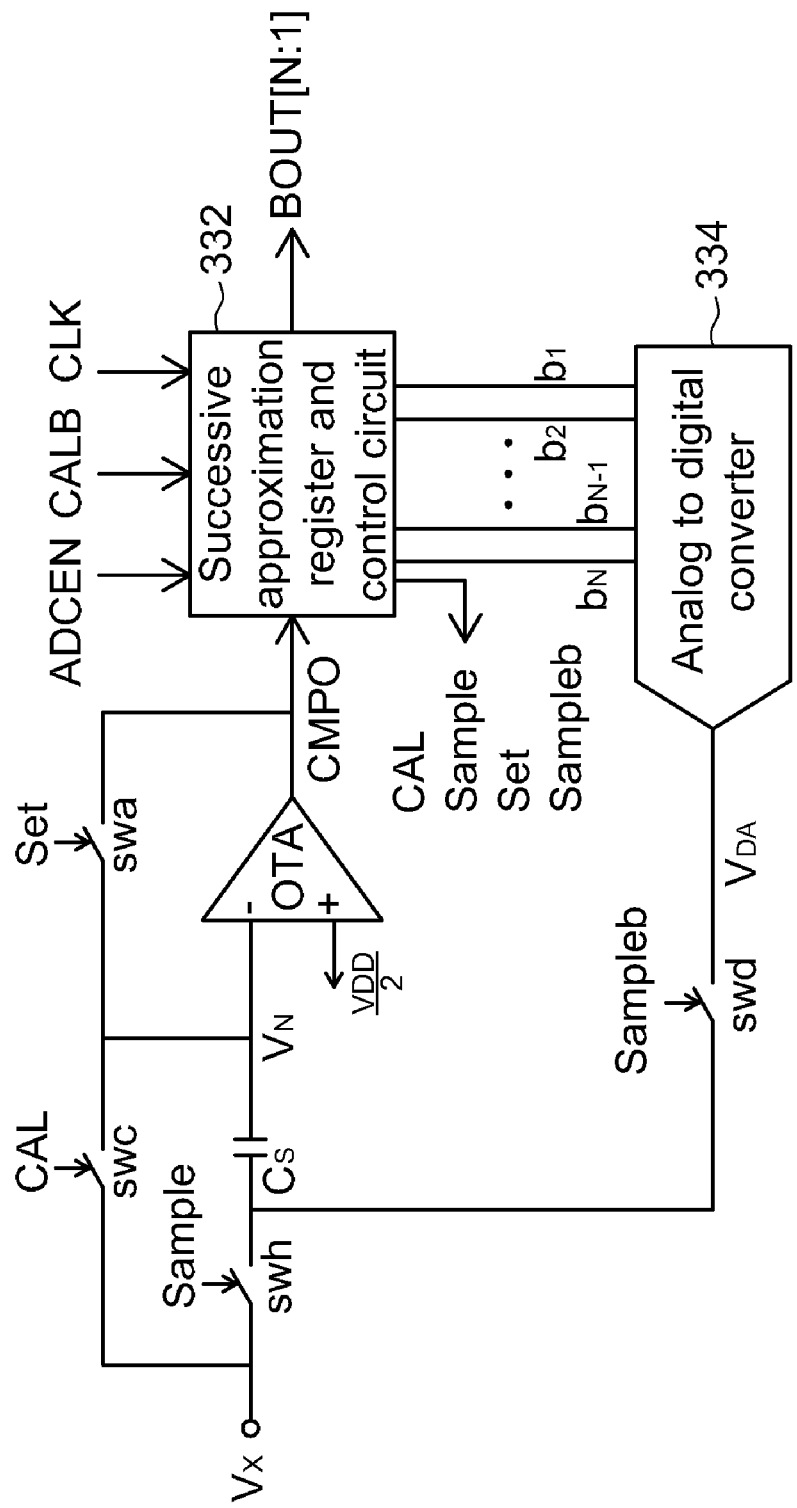
FIG. 8 is a schematic illustration showing an analog to digital converter.

FIGS. 4 and 5 are partially detailed circuit diagrams showing the capacitance measurement circuit 30. FIG. 6 is a detailed circuit diagram showing a variable capacitor circuit. FIG. 7 shows a signal timing chart of the first embodiment. FIG. 8 is a schematic illustration showing an analog to digital converter. Referring to FIGS. 4 to 8, the capacitance measurement circuit 30 may selectively operate in a capacitance setting period or a capacitance measurement period. Preferably, the capacitance measurement circuit 30 can first adjust the equivalent capacitance of the variable capacitor Cx in the capacitance setting period so that the capacitance measurement circuit 30 can measure the capacitor $C_Y$ under test in the capacitance measurement period more correctly.

The capacitance to time unit 310 includes a variable capacitor circuit 312, a current source 314, a switch circuit 316 and a logic unit 318. The variable capacitor circuit 312, such as a capacitor array having the capacitance that may be selected by a switch, provides the variable capacitor Cx. The control logic 350 determines the signal value of the setting signal CSEL[N:0] in the capacitance setting period so that the variable capacitor circuit 312 adjusts the equivalent capacitance of the variable capacitor Cx according to this signal value.

The variable capacitor circuit 312 includes switches SW[0] to SW[N] and capacitors $C_{R0}$ to $C_{RN}$. The switches SW[0] to SW[N] are respectively controlled by signals CSEL[0] to CSEL[N] in the capacitance setting period to determine the equivalent capacitance of the variable capacitor Cx.

The current source 314 provides a current I2. The switch circuit 316 selectively provides the current I2 to the capacitor $C_Y$ under test or the variable capacitor Cx according to an inversion signal Y of the clock signal Y1 and an inversion signal X of the clock signal X1. The logic unit 318 generates the clock signal Y1 and the clock signal X1 according to a reference voltage Vref2, a charge voltage $V_A$ across two ends of the capacitor $C_Y$ under test and a charge voltage $V_B$ across two ends of the variable capacitor Cx. When the charge voltage $V_B$ is higher than the reference voltage Vref2, the clock signal Y1 is converted from a high voltage level into a low voltage level. When the charge voltage $V_A$ is higher than the reference voltage Vref2, the clock signal X1 is converted from the high voltage level into the low voltage level.

The continuous time integrator 320 includes an operational amplifier OP, a resistor Rc, a capacitor $C_1$, a capacitor $C_2$, a switch sw1, a switch switch2 and a switch switch2s. The switch sw1 is selectively electrically connected to the resistor Rc and the logic unit 318 of the capacitance to time unit 310.

The switch sw1 is turned on in response to an enabled level of a control signal Scb to electrically connect the resistor Rc to the logic unit 318 of the capacitance to time unit 310.

An inverting input terminal of the operational amplifier OP is connected to the resistor Rc and for receiving the clock signal Y1. The inverting input terminal of the operational amplifier OP is coupled to the output terminal of the operational amplifier OP via the capacitor $C_1$. A non-inverting input terminal of the operational amplifier OP receives an initial voltage VDD/2. The output terminal of the operational amplifier OP is connected to the input terminal of the analog to digital converter 330.

The switch switch2 is selectively electrically connected to the inverting input terminal and the output terminal of the operational amplifier OP. The switch switch2 is turned on in response to an enabled level of a control signal Sc to electrically connect the inverting input terminal to the output terminal of the operational amplifier OP, and to set the voltages of the inverting input terminal and the output terminal of the operational amplifier OP to be equal to the initial voltage VDD/2.

Capacitance Measurement Period

Synthetically speaking, the capacitance measurement circuit 30 operates in the capacitance measurement period, which may further be divided into a voltage setting period T1 and a voltage integrating period T2. The capacitance measurement circuit 30 firstly operates in the voltage setting period T1. When the capacitance measurement circuit 30 operates in the voltage setting period T1, the control logic 350 enables the control signal Sc and a control signal CALB to drive the continuous time integrator 320 and set the integral signal Vx to be equal to the initial voltage VDD/2. The counter 340 also resets in response to the enabled level of the control signal Sc to recount the number of clocks of the clock signal X1. The control logic 350 disables the control signal Scb, which is the inversion signal of the control signal Sc in the voltage setting period T1. After the voltage setting period T1 is finished and when the voltage integrating period T2 starts, the control signal Scb is further enabled so that the clock signal Y1 can charge/discharge the continuous time integrator 320.

The current source 314 includes an operational amplifier OP1, a N-type metal-oxide semiconductor (NMOS) transistor LN1 serving as a switch, P-type metal-oxide semiconductor (PMOS) transistors LP1 and LP2 serving as switches and a resistor Rb. The current source 314 generates a bias current I1

$$\left(I1 = \frac{Vref2}{R_b}\right)$$

according to a reference voltage Vref1, the operational amplifier OP1, the NMOS transistor LN1, the PMOS transistors LP1 and LP2 and the resistor Rb, and duplicates I1 into I2 according to the working principle of current mirror, wherein I2 may be J times of I1, that is, the current $$I2 = \frac{JVef2}{R_b}.$$

When the node Y is low, the PMOS transistor LP4 serving as the switch is turned on, and the NMOS transistor LN4 serving as the switch is turned off. The variable capacitor Cx starts to be charged with the charge rate $$\frac{dV_B}{dt} = \frac{I2}{C_X} = \frac{JVref2}{R_b C_X}.$$

When the voltage $V_B$ is higher than the voltage Vref2, the comparator OP3 outputs the signal CPB, which is changed from low to high, and the clock signal Y is also changed from low to high. Meanwhile, the clock signal Y1 is changed from high to low, and the time of charging the voltage $V_B$ from 0V to the voltage Vref2 is $$T_X = \frac{Vref2}{\left(\frac{I2}{C_X}\right)} = \frac{R_b C_X}{J}.$$

The time is also the time during which the clock signal Y1 is high. In the time $T_x$, the voltage variation of the integral signal Vx is represented as $$\Delta V \times 2 = -\frac{V_{DD} R_b C_x}{2RcJ(C_1 + C_2)}.$$

After the clock signal Y is changed from low to high, the clock signal X is also changed from high to low so that the PMOS transistor LP3 serving as the switch is turned on and the NMOS transistor LN3 serving as the switch is turned off. The capacitor $C_Y$ under test starts to be charged with the charge rate $$\frac{dV_A}{dt} = \frac{I2}{C_Y} = \frac{JVref2}{R_b C_Y}.$$

Similar to the derivation of the variable capacitor Cx, the time of charging the capacitor $C_Y$ under test from 0V to the voltage Vref2 is represented as $$T_Y = \frac{Vref2}{\left(\frac{I2}{C_Y}\right)} = \frac{R_b C_Y}{J},$$

which is also the time during which the clock signal Y1 is low. In the time $T_Y$, the voltage variation of the integral signal Vx is represented as $$\Delta V \times 1 = \frac{V_{DD} R_b C_Y}{2RcJ(C_1 + C_2)}.$$

According to the above-mentioned description, it is obtained that the time during which the clock signal Y1 is high is the charge time Tx, and the time during which the clock signal Y1 is low is the charge time $T_Y$. When the capacitance measurement circuit 30 operates in the voltage integrating period T2, the control logic 350 disables the control signal Sc and enables the control signal Scb so that the continuous time integrator 320 integrates the clock signal Y1 to output the integral signal Vx. The counter 340 synchronously counts the number of clocks of the clock signal X1. When the counter 340 counts the number of clocks of the clock signal X1, which has reached the default value Nc, it outputs the enable signal EN to the control logic 350. The control logic 350 informs the analog to digital converter 330 to sample the integral signal Vx outputted from the continuous time integrator 320 according to the enable signal ADCEN. After Nc clocks, the integral signal Vx becomes $$V_X(N_C T_{CLK}) = \frac{N_C V_{DD} R_b (C_Y - C_X)}{J2Rc(C_1 + C_2)} + \frac{VDD}{2}.$$

According to the above-mentioned formula, it is obtained that the integral signal Vx linearly relates to the capacitance difference between the capacitor $C_Y$ under test and the variable capacitor Cx. The linearly varying integral signal Vx is outputted to the analog to digital converter, which converts the signal Vx into the digital signal BOUT[N:1] for output, and the capacitance variation of the capacitor $C_Y$ under test is judged according to the digital signal BOUT[N:1].

Figure 9:
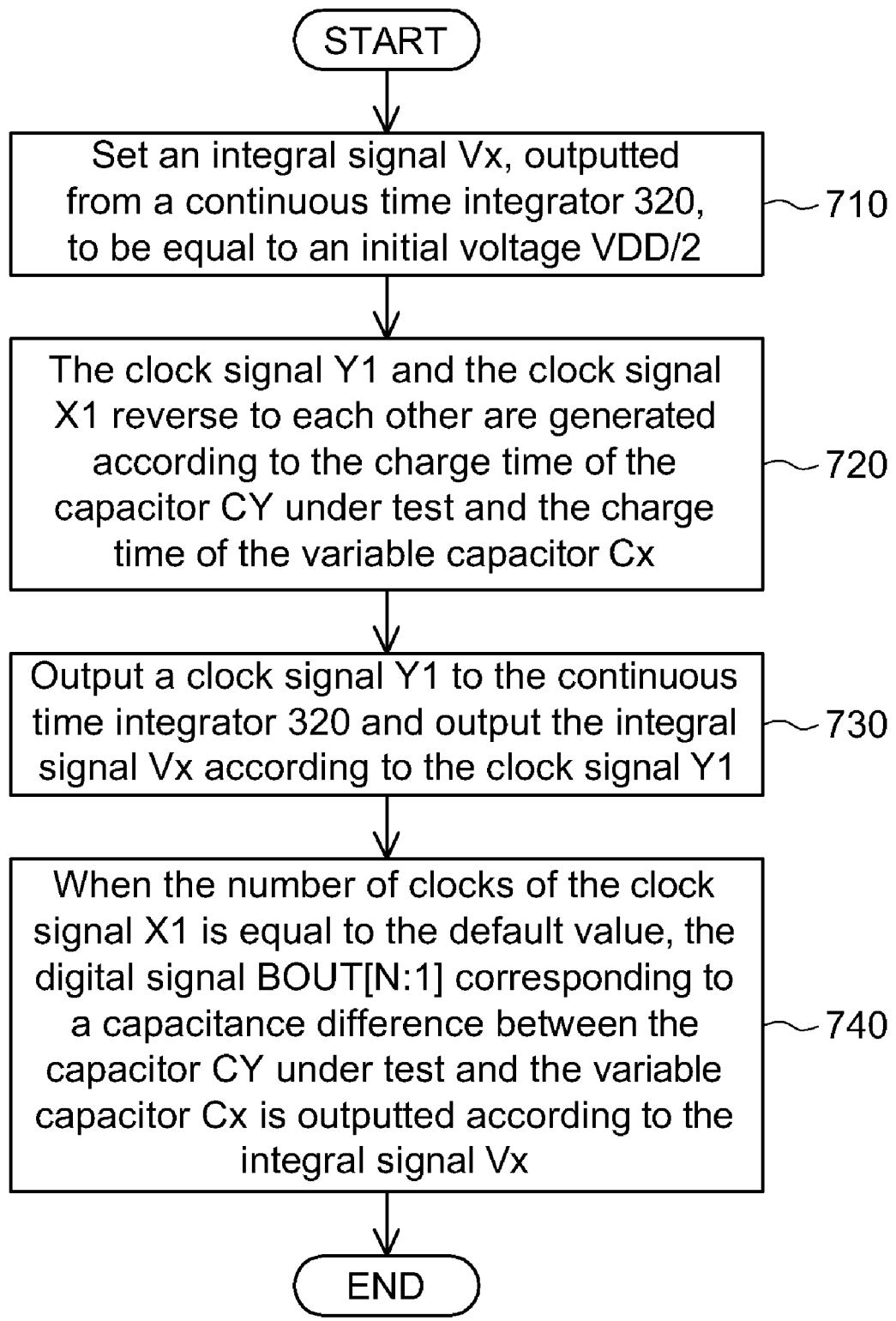
FIG. 9 is a flow chart showing a capacitance measurement method in a capacitance measurement period of the capacitance measurement circuit.

FIG. 9 is a flow chart showing a capacitance measurement method in a capacitance measurement period of the capacitance measurement circuit. In brief, when the capacitance measurement circuit 30 operates in the capacitance measurement period, the following steps are performed. First, as shown in step 710, the integral signal Vx, outputted from the continuous time integrator 320, is set to be equal to the initial voltage VDD/2. Next, as shown in step 720, the clock signal Y1 and the clock signal X1 reverse to each other are generated according to the charge time of the capacitor $C_Y$ under test and the charge time of the variable capacitor Cx. As shown in step 730, the clock signal Y1 is outputted to the continuous time integrator 320, and the integral signal Vx is outputted according to the clock signal Y1. Finally, as shown in step 740, when the number of clocks of the clock signal X1 is equal to the default value, the digital signal BOUT[N:1] corresponding to a capacitance difference between the capacitor $C_Y$ under test and the variable capacitor Cx is outputted according to the integral signal Vx.

Capacitance Setting Period

When the capacitance measurement circuit 30 operates in the capacitance setting period, the variable capacitor circuit 312 is controlled by the setting signal CSEL[N:0] so that the capacitance of the variable capacitor Cx can be equal to or possibly approximate to the capacitance of the capacitor $C_Y$ under test. In the capacitance setting period, it is not important that whether or not the output of the continuous time integrator 320 can very linearly and precisely convert the capacitance difference between the capacitor $C_Y$ under test and the variable capacitor Cx into the voltage range, which can be distinguished by the analog to digital converter 330. Instead, the capacitance difference between the capacitor $C_Y$ under test and the variable capacitor Cx has to be possibly amplified to increase the resolution.

So, in the capacitance setting period, the control logic 350 disables the control signal CALB so that the capacitance of the feedback integrator capacitor of the continuous time integrator 320 is decreased from ($C_1+C_2$) to $C_1$, and the integrated amplification becomes larger to increase the resolution. If the integrating period Ns has elapsed in the capacitance setting period, the integral signal is represented as $$V_X(N_S T_{CLK}) = \frac{N_S V_{DD} R_b (C_Y - C_X)}{J2RcC_1} + \frac{VDD}{2}.$$

The analog to digital converter 330 shown in FIG. 8 is a successive approximation analog to digital converter (SARADC). As shown in FIG. 8, it is obtained that the function of the analog to digital converter 330 is reduced into 1 bit of resolution when the control logic 350 disables the control signal CALB. That is, only the integral signal Vx of the continuous time integrator 320 is compared with the initial voltage VDD/2, and then the output signal CMPO of the comparator OTA in the analog to digital converter 330 is read. If the capacitance of the capacitor $C_Y$ under test is greater than that of the variable capacitor Cx, the comparator OTA outputs a comparison signal CMPO that is low, and the control logic 350 increases the equivalent capacitance of the variable capacitor Cx according to the setting signal CSEL[N:0]. Oppositely, if the capacitance of the capacitor $C_Y$ under test is smaller than that of the variable capacitor Cx, the comparator OTA outputs the comparison signal CMPO that is high, and the control logic 350 decreases the equivalent capacitance of the variable capacitor Cx according to the setting signal CSEL[N:0]. The above-mentioned procedures are repeated until the capacitance is adjusted such that the signal CMPO is low when the minimum unit capacitance $C_{R0}$ that may be adjusted in the variable capacitor circuit 312 is increased and the signal CMPO is high when the minimum unit capacitance $C_{R0}$ is decreased. Thereafter, when the capacitor $C_Y$ under test is being measured, this capacitance is set as the equivalent capacitance of the variable capacitor Cx.

In the capacitance measurement period, the control signal CALB has the enabled level while the control signal CAL has the disabled level. The control logic 350 informs the successive approximation register and the control circuit 332 according to the enable signal ADCEN to enable the control signal Set and the control signal Sample and to disable the control signal Sampleb, which is an inversion signal of the control signal Sample. Thus, the switch swa and the switch swh are turned on, and the switch swd is turned off. Consequently, the switch swa is turned on such that the output terminal and the inverting input terminal of the comparator OTA are short-circuited to set the voltage $V_N$ of the inverting input terminal of the comparator OTA to be equal to the voltage VDD/2 of the noninverting input terminal of the comparator OTA. The switch swh is turned on such that the integral signal Vx is stored in the capacitor Cs. At this time, the successive approximation register and the control circuit 332 make the bit $b_N$ become high, and the digital-to-analog converter 334 can thus output the voltage VDD/2. After a predetermined number of clock signals X1, the successive approximation register and the control circuit 332 make the control signal Set and the control signal Sample have the disabled levels, and make the control signal Sampleb have the enabled level. At this time, the voltage of the inverting input terminal of the comparator OTA is represented as $$V_N = \frac{VDD}{2} + \left[\left(\frac{VDD}{2}\right) - V_X\right].$$

If the integral signal Vx is greater than VDD/2, the voltage $V_N$ is lower than VDD/2 and the signal CMPO is outputted as high, then the bit $b_N$ is held high and stored in the successive approximation register and the control circuit 332. The successive approximation register and the control circuit 332 further make the bit $b_{N-1}$ become high and the digital-to-analog converter 334 outputs the voltage (VDD/2+ VDD/($2^2$)). Then, the voltage of the inverting input terminal of the comparator OTA is represented as $$V_N = \frac{VDD}{2} + \left[\left(\frac{VDD}{2} + \frac{VDD}{2^2}\right) - V_X\right].$$

If the integral signal Vx is smaller than (VDD/2+ VDD/($2^2$)), the voltage $V_N$ is higher than VDD/2 and the signal CMPO is outputted as low, then the bit $b_2$ goes back to low and is stored in the successive approximation register and the control circuit 332. The procedures are repeated until the above-mentioned judging step for the bit $b_1$ is finished. Then, the procedure of converting the integral signal Vx into the digital signal has been finished.

In the capacitance setting period, the control signal CALB and the control signal Set have the disabled levels, the control signal CAL and the control signal Sample have the enabled levels, and the control signal Sampleb has the disabled level. That is, the integral signal Vx is directly transferred to the inverting input terminal of the comparator OTA, and the integral signal Vx outputted from the continuous time integrator 320 is directly compared with the initial voltage VDD/2 so that the analog to digital converter 330 is reduced into 1 bit of resolution and the variable capacitor Cx can be adjusted according to the comparison signal CMPO outputted from the comparator OTA.

Figure 10:
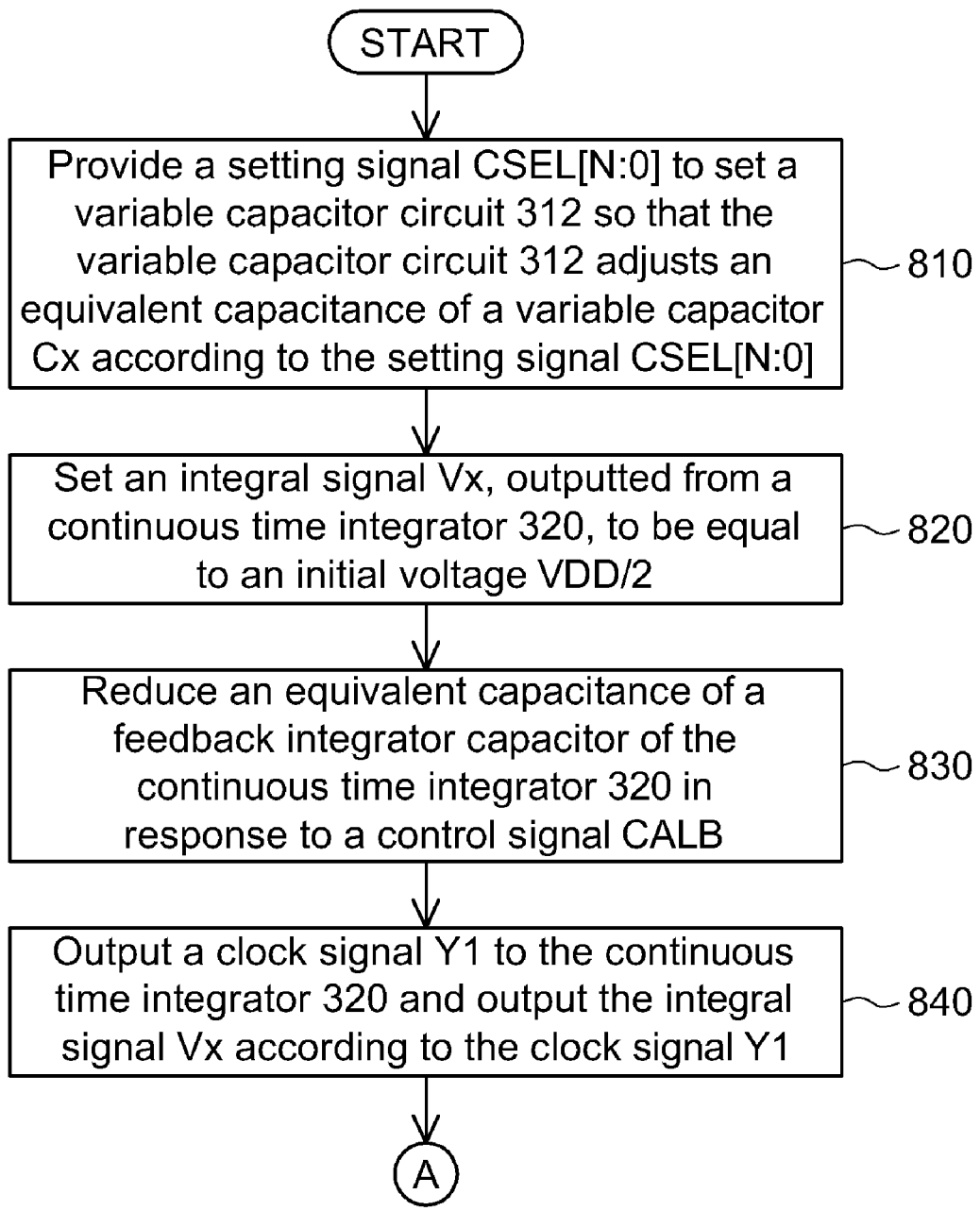
FIGS. 10 and 11 are flow charts showing the capacitance measurement method in a capacitance setting period of the capacitance measurement circuit.
Figure 11:
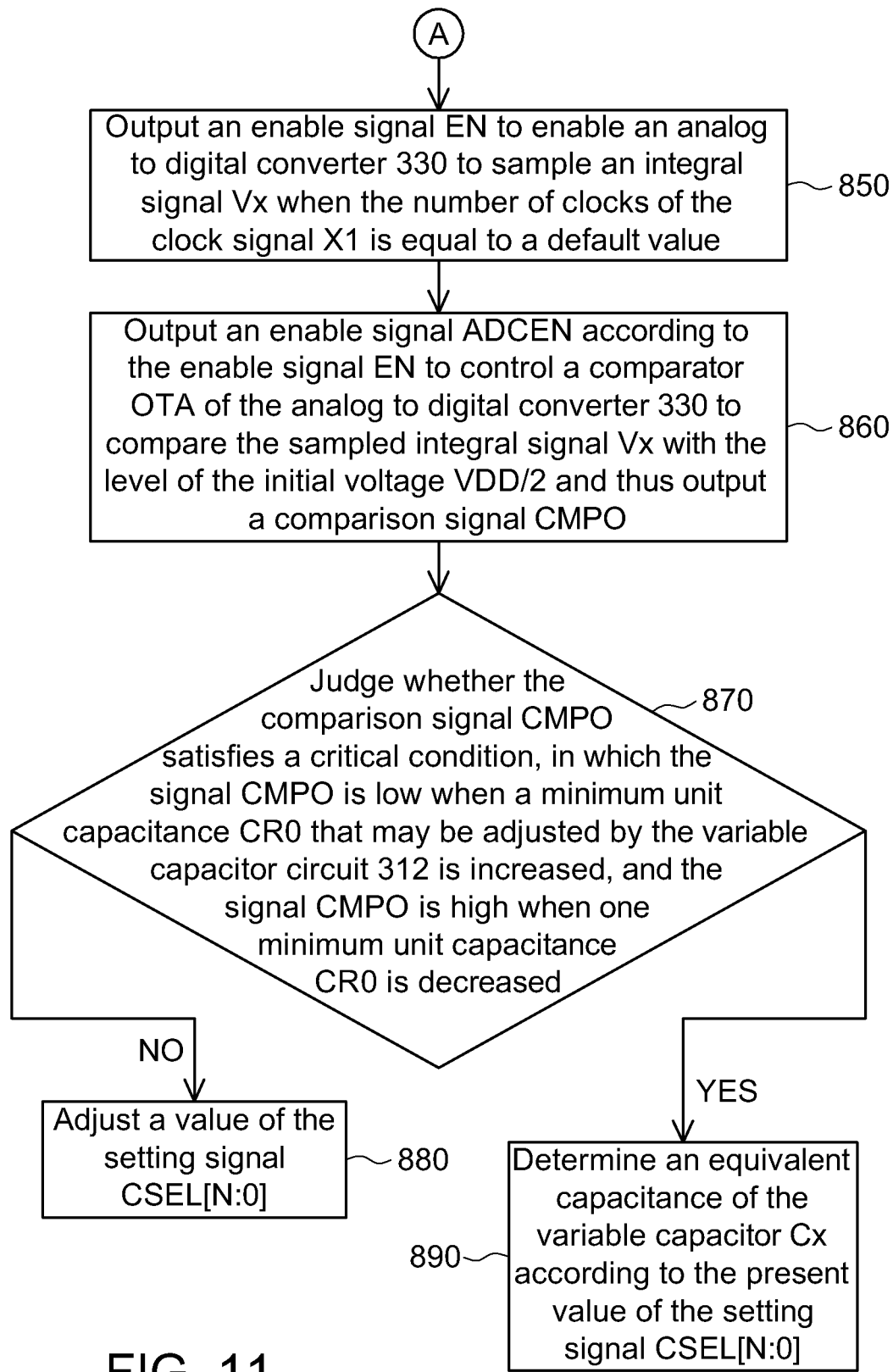

FIGS. 10 and 11 are flow charts showing the capacitance measurement method in a capacitance setting period of the capacitance measurement circuit. In brief, when the capacitance measurement circuit 30 operates in the capacitance setting period, the following steps are performed. First, as shown in step 810, the setting signal CSEL[N:0] is provided to set the variable capacitor circuit 312 so that the variable capacitor circuit 312 adjusts the equivalent capacitance of the variable capacitor Cx according to the setting signal CSEL[N:0]. Next, as shown in step 820, the integral signal Vx outputted from the continuous time integrator 320 is set to be equal to the initial voltage VDD/2. Then, as shown in step 830, the equivalent capacitance of the feedback integrator capacitor of the continuous time integrator 320 is reduced in response to the control signal CALB. Next, as shown in step 840, the clock signal Y1 is outputted to the continuous time integrator 320 and the integral signal Vx is outputted according to the clock signal Y1. Then, as shown in step 850, when the number of clocks of the clock signal X1 is equal to the default value, the enable signal EN is outputted to enable the analog to digital converter 330 to sample the integral signal Vx. Next, as shown in step 860, the enable signal ADCEN is outputted according to the enable signal EN to control comparator OTA of the analog to digital converter 330 to compare the sampled integral signal Vx with the initial voltage VDD/2 and to output the comparison signal CMPO. Then, as shown in step 870, it is judged whether the comparison signal CMPO satisfies the critical condition, in which the signal CMPO is low when the minimum unit capacitance $C_{R0}$, which may be adjusted in the variable capacitor circuit 312, is increased, and the signal CMPO is high when one minimum unit capacitance $C_{R0}$ is decreased. If not, step 880 is performed to adjust the level of the setting signal CSEL[N:0], and the step 820 is repeated. If the critical condition is satisfied, step 890 is performed to determine the equivalent capacitance of the variable capacitor Cx according to the present level of the setting signal CSEL[N:0].

In the capacitance measurement circuit and the capacitance measurement method thereof according to each embodiment of the invention, the drawback that the conventional circuit tends to be influenced by the switch noise can be solved. In addition, the clock signal generated during the charging process may serve as the clock signal for other circuits, and an additional oscillator circuit needs not to be provided so that the manufacturing cost can be greatly reduced.

While the invention has been described by way of a example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance measurement circuit for measuring a capacitor under test, the capacitance measurement circuit comprising:
   a capacitance to time unit for generating a first clock signal and a second clock signal reverse to the first clock signal according to a first charge time of the capacitor under test and a second charge time of a variable capacitor;
   a continuous time integrator for receiving the first clock signal and outputting an integral signal according to the first clock signal; and
   an analog to digital converter for outputting a digital signal corresponding to a capacitance difference between the capacitor under test and the variable capacitor according to the integral signal when the number of clocks of the second clock signal is equal to a default value.

2. The circuit according to claim 1, further comprising:
   a counter for outputting a first enable signal when the number of clocks of the second clock signal is equal to the default value; and
   a control logic for outputting a second enable signal according to the first enable signal to control the analog to digital converter to output the digital signal according to the integral signal.

3. The circuit according to claim 2, wherein:
   the control logic further enables a first control signal in a voltage setting period to drive the continuous time integrator to set the integral signal to be equal to an initial voltage, and disables a second control signal reverse to the first control signal, and further enables the second control signal after the voltage setting period to connect the capacitance to time unit to the continuous time integrator so that the first clock signal charges/discharges the continuous time integrator; and
   the counter further resets in response to an enabled level of the first control signal to recount the number of clocks of the second clock signal.

4. The circuit according to claim 2, wherein:
   the capacitance to time unit further comprises a variable capacitor circuit for providing the variable capacitor;
   the control logic further determines a signal value of a setting signal in a capacitance setting period so that the variable capacitor circuit adjusts an equivalent capacitance of the variable capacitor according to the signal value; and
   the control logic further disables a third control signal in the capacitance setting period.

5. The circuit according to claim 4, wherein the capacitance to time unit further comprises:
- a current source for providing a first current;
- a switch circuit for selectively providing the first current to the capacitor under test or the variable capacitor according to inversion signals of the first clock signal and the second clock signal; and
- a logic unit for generating the first clock signal and the second clock signal according to a reference voltage, a first charge voltage of the capacitor under test and a second charge voltage of the variable capacitor.

6. The circuit according to claim 5, wherein:
- when the second charge voltage is higher than the reference voltage, the first clock signal is converted from a high voltage level into a low voltage level; and
- when the first charge voltage is greater than the reference voltage, the second clock signal is converted from the high voltage level into the low voltage level.

7. The circuit according to claim 1, wherein the continuous time integrator comprises:
- a first resistor;
- a first switch selectively electrically connected to the first resistor and the capacitance to time unit, wherein the first switch is turned on in response to an enabled level of a second control signal to electrically connect the first resistor to the capacitance to time unit;
- an operational amplifier, which comprises:
  - an inverting input terminal, connected to the first resistor, for receiving the first clock signal;
  - a noninverting input terminal for receiving an initial voltage; and
  - an output terminal connected to an input terminal of the analog to digital converter;
- a first capacitor, wherein the inverting input terminal is coupled to the output terminal through the first capacitor;
- a second switch selectively electrically connected to the inverting input terminal and the output terminal, wherein the second switch is turned on in response to an enabled level of a first control signal to electrically connect the inverting input terminal to the output terminal, and to set voltages of the inverting input terminal and the output terminal to be equal to the initial voltage.

8. The circuit according to claim 7, wherein the continuous time integrator circuit further comprises a second capacitor and a third switch, which are serially connected to the inverting input terminal and the output terminal, wherein the third switch is turned on in response to an enabled level of a third control signal so that the first capacitor is connected to the second capacitor in parallel.

9. A capacitance measurement method for measuring a capacitor under test, the capacitance measurement method comprising the steps of:
- (a) setting an integral signal, outputted from a continuous time integrator, to be equal to an initial voltage;
- (b) generating a first clock signal and a second clock signal reverse to each other according to a first charge time of the capacitor under test and a second charge time of a variable capacitor;
- (c) outputting the first clock signal to the continuous time integrator and outputting the integral signal according to the first clock signal; and
- (d) outputting a digital signal corresponding to a capacitance difference between the capacitor under test and the variable capacitor according to the integral signal when the number of clocks of the second clock signal is equal to a default value.

10. The method according to claim 9, wherein the step (d) comprises:
- (d1) outputting a first enable signal when the number of clocks of the first clock signal is equal to a default value; and
- (d2) outputting a second enable signal according to the first enable signal to control an analog to digital converter to output the digital signal according to the integral signal.

11. The method according to claim 9, wherein the step (b) comprises:
- (b1) providing a first current;
- (b2) providing the variable capacitor according to a capacitance setting signal;
- (b3) selectively providing the first current to the capacitor under test or the variable capacitor according to inversion signals of the first clock signal and the second clock signal; and
- (b4) generating the first clock signal and the second clock signal according to a reference voltage, a first charge voltage of the capacitor under test and a second charge voltage of the variable capacitor.

12. The method according to claim 11, wherein in the step (b4), the first clock signal is converted from a high voltage level into a low voltage level when the second charge voltage is higher than the reference voltage, and the second clock signal is converted from the high voltage level into the low voltage level when the first charge voltage is higher than the reference voltage.

13. The method according to claim 9, further comprising the step of:
- (e) adjusting a capacitance of the variable capacitor to approximate a capacitance of the capacitor under test according to a capacitance setting signal.

14. The method according to claim 9, further comprising, before the step (a), the steps of:
- (f) providing a setting signal to set a variable capacitor circuit so that the variable capacitor circuit adjusts an equivalent capacitance of the variable capacitor according to the setting signal;
- (g) setting the integral signal, outputted from the continuous time integrator, to be equal to the initial voltage;
- (h) outputting the first clock signal to the continuous time integrator, and outputting the integral signal according to the first clock signal;
- (i) outputting a first enable signal to enable an analog to digital converter to sample the integral signal when the number of clocks of the second clock signal is equal to a default value;
- (j) outputting a second enable signal according to the first enable signal to control the analog to digital converter to output a digital signal corresponding to a capacitance difference between the capacitor under test and the variable capacitor according to the sampled integral signal;
- (k) judging whether or not the digital signal satisfies a critical condition and approximates to a reference digital signal, and performing step (l) if not, or performing step (m) if yes;
- (l) adjusting a value of the setting signal and repeating the step (g); and
- (m) determining the equivalent capacitance according to the value of the setting signal.

15. The method according to claim 14, further comprising, between the steps (g) and (h), the step of:
- (n) reducing an equivalent capacitance of a feedback integrator capacitor of the continuous time integrator in response to a control signal.

* * * * *